United States Patent
Kalifa et al.

(10) Patent No.: US 11,165,224 B2
(45) Date of Patent: Nov. 2, 2021

(54) VERTICAL-CAVITY SURFACE-EMITTING LASER LAYOUT FOR HIGH BANDWIDTH OUTPUT

(71) Applicant: Mellanox Technologies, Ltd., Yokneam (IL)

(72) Inventors: Itshak Kalifa, Ramat Gan (IL); Elad Mentovich, Tel Aviv (IL); Sylvie Rockman, Zichron Yaakov (IL)

(73) Assignee: Mellanox Technologies, Ltd., Yokneam (IL)

( * ) Notice: Subject to any disclaimer, the term of this patent is extended or adjusted under 35 U.S.C. 154(b) by 209 days.

(21) Appl. No.: 16/015,533

(22) Filed: Jun. 22, 2018

(65) Prior Publication Data
US 2018/0375287 A1  Dec. 27, 2018

Related U.S. Application Data

(60) Provisional application No. 62/524,854, filed on Jun. 26, 2017.

(51) Int. Cl.
*H01S 5/042* (2006.01)
*H01S 5/183* (2006.01)
(Continued)

(52) U.S. Cl.
CPC ...... *H01S 5/18344* (2013.01); *G01R 31/2644* (2013.01); *G01R 31/44* (2013.01);
(Continued)

(58) Field of Classification Search
CPC ..... H01S 5/0425–0428; H01S 5/18394; H01S 5/18344–18352; H01S 5/18–187
See application file for complete search history.

(56) References Cited

U.S. PATENT DOCUMENTS

| | | | |
|---|---|---|---|
| 6,687,268 B2* | 2/2004 | Kitamura | H01S 5/0422 372/22 |
| 7,061,956 B2* | 6/2006 | Eitel | H01S 5/18341 372/44.01 |

(Continued)

FOREIGN PATENT DOCUMENTS

WO    WO-2013176202 A1 *  11/2013    ............. H01L 24/75

OTHER PUBLICATIONS

Enplas, "Optical Devices", Aug. 26, 2012 to Nov. 16, 2016, Internet Archive at <https://web.archive.org/web/20160731085317/http://www.enplas.co.jp:80/english/business/opto_product/> 2 pages, retrieved on Sep. 29, 2018.

(Continued)

*Primary Examiner* — Tod T Van Roy
(74) *Attorney, Agent, or Firm* — Alston & Bird LLP

(57) ABSTRACT

A layout for a vertical-cavity surface-emitting laser (VCSEL) is provided. In an example embodiment, the layout comprises a VCSEL, an etched shape around a mesa of the VCSEL, a signal contact layer deposited on section of the mesa, and a ground contact layer. The ground contact layer comprises three parts and is positioned around a first section of the etched shape. The first part of the ground contact layer is deposited on a second section of the etched shape. The second and third parts of the ground contact layer comprise two legs off of the first part. The two legs are symmetrically positioned about two sides of the signal contact layer to form a ground-signal-ground configuration.

19 Claims, 4 Drawing Sheets

(51) Int. Cl.
  *H01S 5/00* (2006.01)
  *G01R 31/44* (2020.01)
  *G01R 31/26* (2020.01)
  *H01S 5/062* (2006.01)
  *H01S 5/42* (2006.01)
  *H01S 5/02345* (2021.01)

(52) U.S. Cl.
  CPC ........ *H01S 5/0014* (2013.01); *H01S 5/04257* (2019.08); *H01S 5/06226* (2013.01); *H01S 5/18394* (2013.01); *H01S 5/02345* (2021.01); *H01S 5/04254* (2019.08); *H01S 5/423* (2013.01); *H01S 2301/176* (2013.01)

(56) References Cited

U.S. PATENT DOCUMENTS

| | | | | |
|---|---|---|---|---|
| 7,382,813 | B2* | 6/2008 | Kaneko | H01S 5/0425 |
| | | | | 372/43.01 |
| 7,505,503 | B2* | 3/2009 | Nguyen | H01S 5/18352 |
| | | | | 372/50.124 |
| 9,698,568 | B2* | 7/2017 | Iwata | H01S 5/18311 |
| 2008/0043793 | A1* | 2/2008 | Ueki | H01S 5/18311 |
| | | | | 372/38.05 |
| 2010/0195689 | A1* | 8/2010 | Ariga | H01S 5/0422 |
| | | | | 372/46.01 |
| 2012/0032225 | A1* | 2/2012 | Hamaguchi | H01L 24/06 |
| | | | | 257/99 |
| 2018/0356459 | A1* | 12/2018 | Kubota | H01S 5/04256 |

OTHER PUBLICATIONS

Suss Microoptics SA, "Microlens Arrays", 2007 Catalog, retrieved from <http://www.amstechnologies.com/fileadmin/amsmedia/downloads/2067_SMO_catalog.pdf> on Sep. 29, 2018, 22 pages.

Suss Mircrooptics SA, "ZEMAX$^a$ Simulation of Fiber-To-Fiber Coupling", Technical Information Sheet 07, Feb. 2004, retrieved from <http://www.amstechnologies.com/fileadmin/amsmedia/downloads/2087_SMO_TechInfo_Sheet_07.pdf> on Sep. 29, 2018, 3 pages.

* cited by examiner

VERTICAL-CAVITY SURFACE-EMITTING LASER LAYOUT FOR HIGH BANDWIDTH OUTPUT

CROSS REFERENCE TO RELATED APPLICATIONS

This application claims priority to U.S. Provisional Application No. 62/524,854, filed Jun. 26, 2017, the content of which is incorporated herein in its entirety by reference.

BACKGROUND

Embodiments of the present invention relate generally to reducing parasitics in vertical-cavity surface-emitting lasers (VSCELs) to increase the efficiency and bandwidth frequency of the output laser. VSCELs are often used to convert electrical signals to optical signals for use in fiber optic data and analog transmission through fiber optic cable systems. Systems and methods are described herein according to embodiments of the present invention that allow for increased transmission speeds through the fiber optic cable systems by utilizing a new type of VCSEL layout.

BRIEF SUMMARY

The use of VCSELs for transmission of optical signals in fiber optic systems has provided several advantages over edge-emitting lasers. For example, VCSELs generally require less power consumption and can be manufactured more efficiently than edge-emitting lasers, especially when on-chip testing capability is provided, which can result in a considerable cost advantage as compared to edge-emitting lasers. Furthermore, VCSELs typically provide reliable operation over time, which can be very important for applications in fiber optic systems.

To meet the continuously growing demands for increased bandwidth in telecommunication networks caused by growing data traffic in big data centers as well as in local and access networks, the inventors have recognized a need for a layout of VCSELs on an optical chip which reduces parasitics (e.g., unwanted capacitance or resistance) of the VCSEL. The reduction of the parasitics thus increases the VCSEL output frequency.

Embodiments of the present invention utilize a ground-signal-ground (GSG) layout with an etched shape around the VCSEL mesa, such that the data transmission capabilities of a VCSEL are not limited by the parasitic capacitance of traditional VCSEL layout designs.

According to a first aspect of the present invention, a layout for a VCSEL is provided. In an example embodiment, the layout for the VCSEL comprises a VCSEL; an etched shape around a mesa of the VCSEL; a signal contact layer deposited on a section of the mesa of the VCSEL; and a ground contact layer. The ground contact layer comprises three parts that are positioned around a first section of the etched shape. A first part of the ground contact layer is deposited on a second section of the etched shape. Second and third parts of the ground contact layer comprise two legs off the first part. The two legs are symmetrically positioned about two sides of the signal contact layer to form a ground-signal-ground configuration.

In an example embodiment, the signal contact layer comprises a probe notch, wherein the probe notch is configured to guide a testing probe.

In an example embodiment, the etched shape is a portion of an annulus about the mesa of the VCSEL. In an example embodiment, an interior edge of the annulus has a mesa diameter defined by the mesa and an outer edge of the annulus has a second diameter defined by the first part of the ground contact layer.

In an example embodiment, a first gap defining a first width separates the second part of the ground contact layer and the signal contact layer and a second gap defining a second width separates the third part of the ground contact layer, the first width being approximately the same as the second width. In an example embodiment, the first width and the second width are between 19 and 20 micrometers.

According to another aspect of the present invention, a layout for a VCSEL is provided. In an example embodiment, the layout for the VCSEL comprises a VCSEL; a signal contact layer deposited on a section of a mesa of the VCSEL; and a ground contact layer. The ground contact layers comprises a first leg portion, a second leg portion, and an arc portion. The arc portion partially encircles the mesa. The first leg portion and the second leg portion extend symmetrically from opposite ends of the arc portion. The signal contact layer extends between the first leg portion and the second leg portion to form a ground-signal-ground configuration. The layout for the VCSEL further comprises an etched shape positioned between the arc portion of the ground contact layer and a corresponding portion of the signal contact layer.

In an example embodiment, the signal contact layer comprises a probe notch, wherein the probe notch is configured to guide a testing probe.

In an example embodiment, the etched shape is a portion of an annulus about the mesa of the VCSEL. In an example embodiment, an interior edge of the annulus has a mesa diameter defined by the mesa and an outer edge of the annulus has a second diameter defined by the arc portion of the of the ground contact layer.

In an example embodiment, a first gap defining a first width separates the first leg portion of the ground contact layer and the signal contact layer and a second gap defining a second width separates the second leg portion of the ground contact layer, the first width being approximately the same as the second width. In an example embodiment, the first width and the second width are between 19 and 20 micrometers.

According to still another aspect of the present invention, a layout for a VCSEL is provided. In an example embodiment, the layout for the VCSEL comprises a VCSEL; a signal contact layer deposited on a section of a mesa of the VCSEL; and a ground contact layer comprising a first leg portion, a second leg portion, and an arc portion. The arc portion partially encircles the mesa and the first leg portion and the second leg portion extend symmetrically from opposite ends of the arc portion. The signal contact layer extends between the first leg portion and the second leg portion to form a ground-signal-ground configuration. The signal contact layer comprises a probe notch, wherein the probe notch is configured to guide a testing probe.

In an example embodiment, the probe notch is a V-shaped notch. In an example embodiment, the notch comprises a notch opening that is 20 to 25 micrometers wide. In an example embodiment, the notch extends 10 to 25 micrometers into the signal contact layer. In an example embodiment, the VCSEL layout further comprises an etched shape positioned between the arc portion of the ground contact layer and a corresponding portion of the signal contact layer.

BRIEF DESCRIPTION OF THE DRAWING(S)

Having thus described the invention in general terms, reference will now be made to the accompanying drawings, which are not necessarily drawn to scale, and wherein:

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "about," "around," etc. are used for explanatory purposes in the examples provided below to describe the relative position of certain components or portions of components. As used herein, the term "approximately" refers to tolerances within manufacturing and/or engineering standards.

Figure 1:
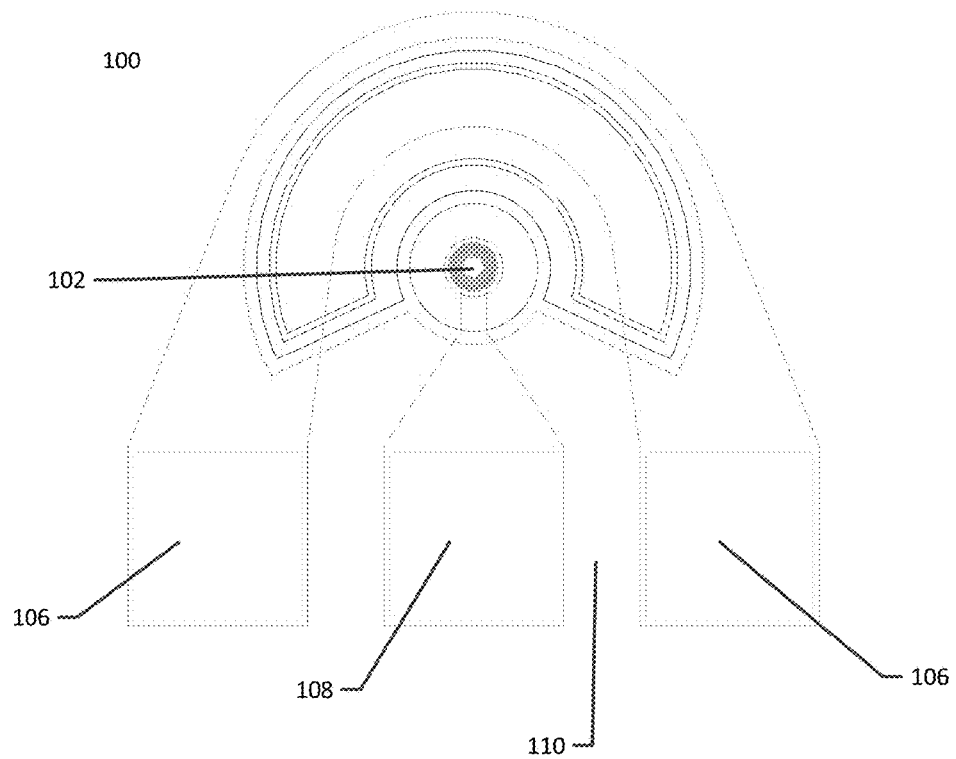
FIG. 1 illustrates a schematic top view of a typical ground-signal-ground vertical-cavity surface-emitting laser (VCSEL) layout.

FIG. 1 illustrates a typical ground-signal-ground vertical-cavity surface-emitting laser (VCSEL) layout 100 on an optical chip. As described herein, a VCSEL layout comprises the position of a VCSEL and the position of contact layers connected to a VCSEL on an optical chip or wafer. The optical chip may comprise one or more VCSELs 102 in the VCSEL layout 100 or an array of VCSELs 102 arranged over a plurality of VCSEL layouts 100. The VCSEL 102 may be configured to output light for use in a variety of applications, such as fiber optic data transmission in high-speed fiber optic communication systems.

Figure 2:
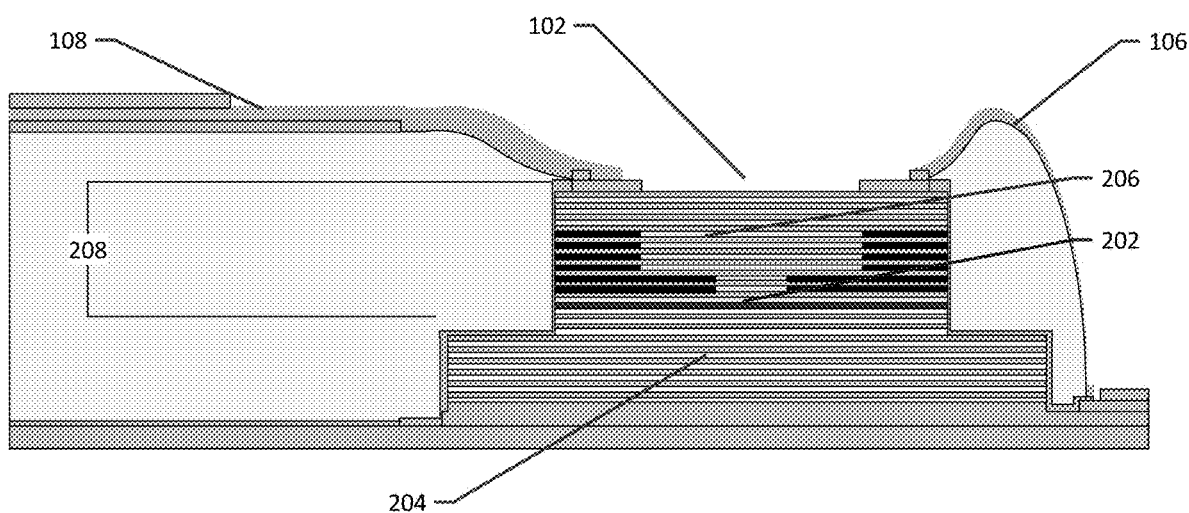
FIG. 2 illustrates a schematic side view of a VCSEL according to an example embodiment.

As shown in FIG. 2 the structure of the VCSEL 102 may include an active region 202 disposed between two reflector stacks 204 and 206. The VCSEL 102 may also include a mesa structure 208. Contact layers 108 and 106 may be provided on either side of the VCSEL 102 and may be configured to conduct electricity through the VCSEL 102, such that light can be generated in the active region 202 and the reflector stacks 204 and 206 and output through the top of the VCSEL 102, as shown in FIGS. 1 and 2. In some examples, the entire structure comprises metallic material to allow for future wire bonding.

Referring back to FIG. 1, the contact layer 106 may serve as an electrical ground, while the contact layer 108 may serve as the electrical signal layer that is configured to provide current to the VCSEL 102. For example, providing an electrical current to the contact layer 108 may energize the VCSEL 102 such that light (e.g., an optical signal) is output from the VCSEL 102 while the electrical circuit is completed by the contact layer 106.

In the manufacturing process, a photolithography process may be used to define bond pads including a gap 110 between the contact layer 108 and the contact layer 106. The process may then include depositing the contact pads on the bond pads and utilizing a lift off phase to remove excess conducting material.

Through hard work and applied ingenuity, the inventors have discovered a new layout design of a VCSEL in which the parasitics of the VCSEL layout described herein are reduced as compared with existing VCSEL designs. In some examples, the VCSEL layout 400 shown in FIG. 3 and described below reduces the parasitic properties of the VCSEL layout, such that a frequency of the optical signal output from the VCSEL can increase from 20 gigahertz (GHz) to 30 GHz. In some examples, with further improvements the frequency of the optical signal output may approach a limit of 70 GHz.

Figure 3:
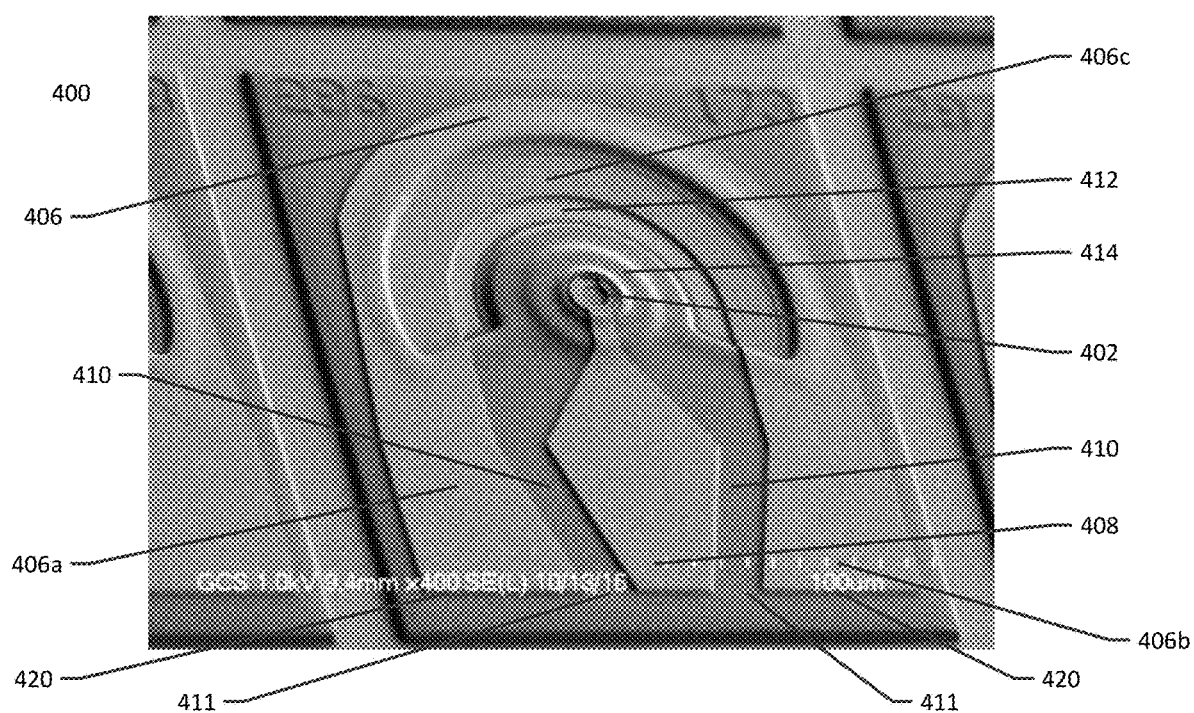
FIG. 3 illustrates a perspective top view of a ground-signal-ground VCSEL layout according to an example embodiment.
Figure 4:
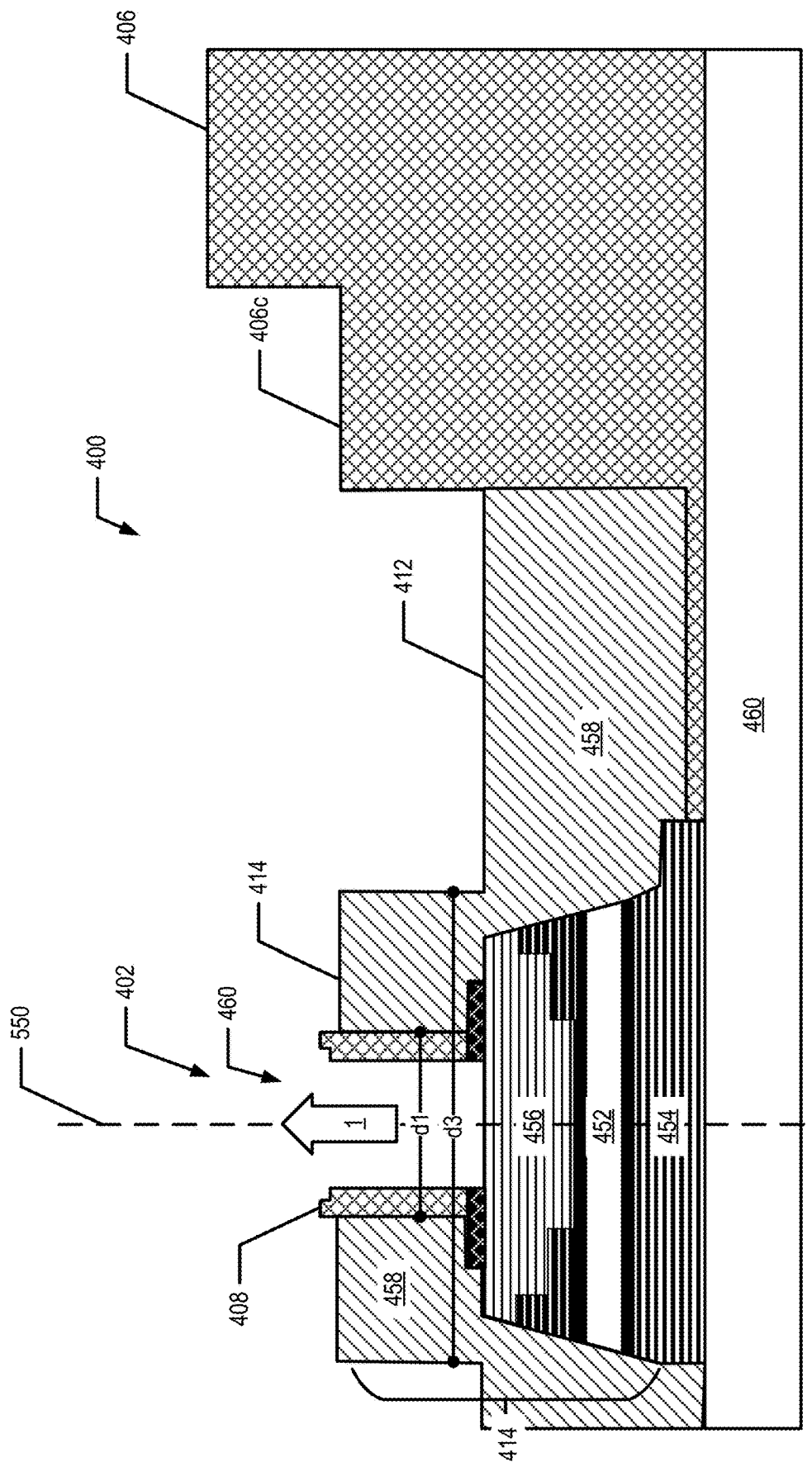
FIG. 4 illustrates a partial cross-section view of a ground-signal-ground VCSEL layout according to an example embodiment.
Figure 5:
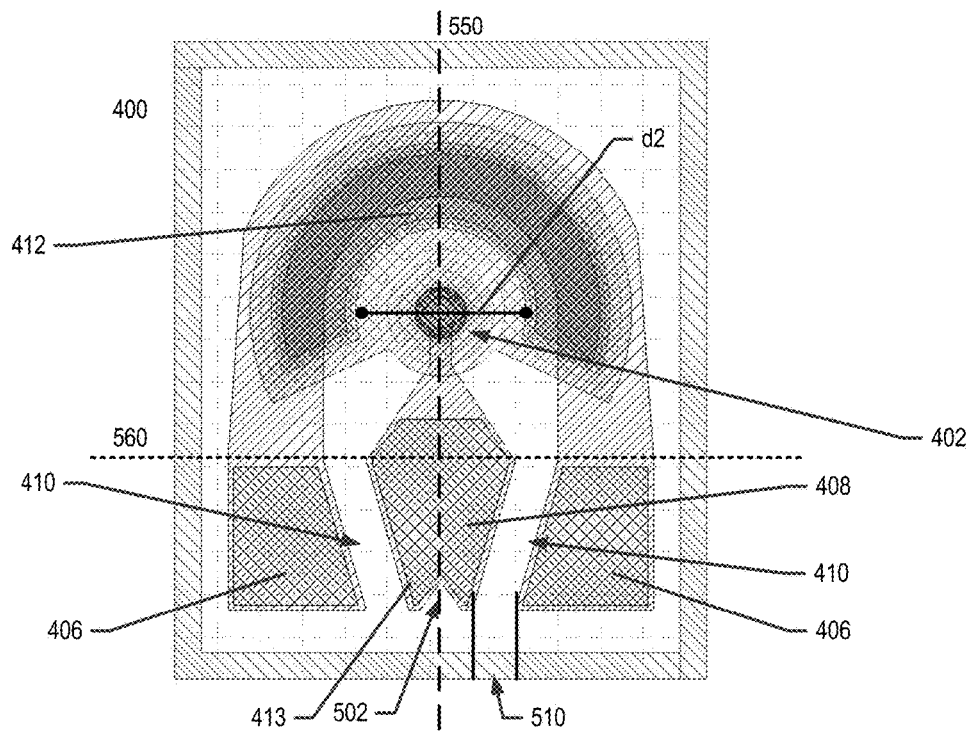
FIG. 5 illustrates a schematic top view of a ground-signal-ground VCSEL layout according to an example embodiment.

FIGS. 3-6 illustrate a ground-signal-ground VCSEL layout according to example embodiments. Specifically, FIG. 3 illustrates a top perspective view of a VCSEL layout 400 and FIG. 4 provides a cross-section of an example embodiment of the VCSEL layout 400 illustrated in FIG. 3. The VCSEL layout 400 includes a VCSEL 402, a first contact layer 408, a second contact layer 406, and a gap 410 between the first and second contact layers 406 and 408. In an example embodiment, the first contact layer 408 is a signal contact layer and the second contact layer 406 is a ground contact layer. In some examples, the material making up the contact layers may comprise gold. In some examples, the VCSEL 402 is similar to the VCSEL 102 described in FIG. 2. For example, an example embodiment of the VCSEL 402 comprises may include an active region 452 disposed between two reflector stacks 454 and 456. The active region 452 and the reflector stacks 454 and 456 may define the mesa structure 414. For example, the mesa structure 414 may comprise the active region 452 sandwiched between the reflector stacks 454 and 456. The first contact layer 408 may encircle the VCSEL opening 460 such that the first contact layer 408 defines an aperture of the VCSEL 402 having a first diameter d1 and through which the light 1 is emitted from the VCSEL. For example, the first contact layer 408 may at least partially extend around the top of the mesa structure 414. In an example embodiment, the first diameter d1 is approximately 22.398 micrometers (μm). For example, the first diameter d1 may be 21-24 μm.

The second contact layer 406 may extend in an arc around the VCSEL 402 at a second diameter d2 that is greater than the second diameter d1. In an example embodiment, the second diameter d2 is approximately two to four times greater than the first diameter d1. In the illustrated embodiment of FIG. 3, the first contact layer 408 serves as the electrical signal layer that is configured to provide current to the VCSEL 402, and the second contact layer 406 serves as the electrical ground to complete the electrical circuit. The layout 400 may also include an etched section including an etched shape 412 about a mesa 414 of the VCSEL 402. In an example embodiment, the etched shape 412 may be a portion about the mesa 414 that has been etched down to a dielectric and/or insulating material 458. In an example embodiment, the insulating material 458 is Benzocyclobutene (BCB). In an example embodiment, the VCSEL 402 is formed on a substrate 460. For example, an arc-shaped trench may be etched about the mesa structure 414 between the first contact layer 408 and the second contact layer 406. In some examples, this process includes standard metallization in the P-N contact layer. For example, Ti/Pt/Au may be used for the P contact layer and Ge/Ni/Pt/Ti/Au may be used for the N contact layer.

In some examples, the layout for the VCSEL 400 comprises the VCSEL 402 and the etched shape 412 around the mesa 414 of the VCSEL 402. The layout 400 may also include the first contact layer 408 deposited on a section of the mesa 414 of the VCSEL 402. The layout may also include the second contact layer 406. In various embodiments, the second contact layer 406 comprises three parts or portions. A first part 406c of the second contact layer 406 may be deposited on a section of the etched shape, and a second part 406a and a third part 406b of the second contact layer 406 may each comprise a leg extending from the first part. For example, the second contact layer 406 may comprise an arc portion, such as the first part 406c, and leg or extended portions, such as the second and third parts 406a and 406b. In an example embodiment, the first part 406c is an arc portion defined by the second diameter d2. In an example embodiment, the legs (second and third parts 406a and 406b) extend from opposite ends of the arc portion (the first part 406c) away from the arc portion such that a first end of each leg is at least partially in contact (e.g., in electrical contact) with the arc portion (the first part 406c) and a second end of each leg is disposed at a distal position with respect to the arc portion. The two legs or extended portions (the second and third parts 406a and 406b) may be symmetrically positioned about two sides of the first contact layer 408 to form a ground-signal-ground configuration. In an example embodiment, the first and second contact layers 408, 406 may be generally M-shaped. For example, the second and third parts 406a and 406b of the second contact layer 406 may provide the outer legs of the M shape, the first contact layer 408 may provide the middle leg of the M shape, and the first part 406c of the second contact layer 406 may provide an intermediate arched or bent portion connecting the two outer legs of the M shape.

In particular, the second part 406a and the third part 406b of the second contact layer 406 may be configured such that a distal end 420 of each (e.g., an end that is distal for the first part 406c) is wider than portions of the second and third parts 406a, 406b that are more proximal to the first part 406a. In this way, distal ends 411 of the gap 410 extend towards each other at the distal end 420 of the second and third parts 406a, 406b of the second contact layer 406. For example, the distal end 413 of the first contact layer 408 is the end of the first contact layer 408 that is distal to the mesa 414. The distal end 413 of the first contact layer 408 may be tapered. For example, the second and third parts 406a and 406b (e.g., the legs and/or extended portions of the second contact layer 406) may widen starting at an inflection point 560 and continue to widen toward the distal ends 420 thereof and the first contact layer 408 may narrow or taper starting at the inflection point 560 and continue to narrow toward the distal end 413 of the first contact layer. In an example embodiment, the second and third parts 406a and 406b (e.g., the legs and/or extended portions of the second contact layer 406) the taper or narrow between the first part 406c and the inflection point. For example, the width of the second and third parts 406a and 406b (e.g., the legs and/or extended portions of the second contact layer 406) may be smaller at the inflection point 560 compared to where the second and third parts 406a and 406b extend from and/or contact the first part 406c of the second contact layer 406. In an example embodiment, the width of the second and third part 406a and 406b may be approximately constant between the first part 406c and the inflection point 560. In an example embodiment, the inflection point 560 is located closer to the mesa 414 of the VCSEL layout 402 than to the distal ends 420, 413 of the first and second contact layers 408, 406. In an example embodiment, the first part 406c may comprise an arc portion and the second and third parts 406a, 406b, may comprise a first leg portion and a second leg portion that extend symmetrically from opposite ends of the arc portion.

The inventors have determined that the layout shown in FIG. 3 provides more current to the VCSEL 402 than standard layouts and reduces the amount of current that would be parasitically drained through other materials in the VCSEL layout 400. In particular, the "M"-like shape provided by the second contact layer 406 and the first contact layer 408 extending therebetween (e.g., between the a second part 406a and a third part 406b) reduces the parasitics of the VCSEL 402. The increased current sent directly to the VCSEL 402 provides the increased frequency of the optical signal output from the VCSEL 402. In some examples, the VCSEL 402 also provides low cross talk between neighboring VCSELs such as shown in the VCSEL array 600 depicted in FIG. 6. The VCSEL 402 may also provide low noise levels and facilitate testing through the use of a notch 502 through pattern recognition for standard testing of the VCSEL.

As shown in FIGS. 3-6, the VCSEL layout 400 includes the etched shape 412. As described above, the etched shape 412 further decreases the parasitic materials around the mesa of VCSEL 402, to lower the parasitic capacitance of the VCSEL layout 400. In some examples, the etched shape 412 comprises an arc and/or a half or semi-circle shape, such as a "C" shape around the mesa of the VCSEL 402. For example, the etched shape 412 may be a portion of an annulus defined by the first diameter d1 or by the mesa diameter d3 at the interior edge of the annulus and the second diameter d2 at the outer edge of the annulus.

As shown in FIG. 4, the first part 406c of the second contact layer 406 and the etched shape 412 may comprise a stepped feature such that the thickness of the VCSEL is smaller proximate the mesa 414 than at other positions of the VCSEL layout 402. For example, the distance between the substrate 460 and the exterior surface of the VCSEL may be smaller at the etched shape 412 than at other portions of the VCSEL (e.g., in the gap 410, the first part 406c of the second contact layer 406, the second or third parts 406a, 406b of the second contact layer 406, the first contact layer 408). In an example embodiment, the etched shape 412 extends around at least half of the perimeter of the mesa 414 (e.g., at least half way around the circumference defined by d3). In an example embodiment, the etched shape 412 extend around greater than half perimeter of the mesa 414 (e.g., approximately 60% of the way around 66.67% of the way around, 75% of the way around, and/or the like).

Furthermore, in some examples, the VCSEL layout 400 is symmetrical such that the gap 410 on both sides of the first contact layer 408 and between the first contact layer 408 and the second contact layer 406 are the same shape and distance on both sides of an axis 550. For example, the width of the gap 410 between the first contact layer 408 and the legs of the second contact layer 406 may be the same on both sides of the first contact layer 408. The gap 410 may, for example, have a width 510. In some examples, the width 510 is approximately 19.23213 µm. In other examples, the width 510 may be between 19 µm and 20 µm. In any of the above examples, the gap 410 may be the same on both sides of the first contact layer 408. For example, a gap 410 may be disposed between the second part 406a (e.g., a first leg) of the second contact layer 406 and the first contact layer 408 such that the gap 410 separates the second part 406a (e.g., a first leg) of the second contact layer 406 from the first contact layer 408 by a first width. Similarly, a gap 410 may be disposed between the third part 406*b* (e.g., a second leg) of the second contact layer 406 and the first contact layer 408 such that the gap 410 separates the third part 406*b* (e.g., a second leg) of the second contact layer 406 from the first contact layer 408 by a second width. The first and second width may be approximately equal.

In another example embodiment, the VCSEL layout 400 includes a notch 502 in the first contact layer 408. The notch 502 may be a probe notch configured to provide a guide for a testing probe in the testing stage of VCSEL manufacturing. The notch 502 may thus allow the probe to more easily make contact with the first contact layer 408, such that the probe can provide a testing electrical current to the VCSEL 402. In an example embodiment, the notch 502 is a V-shaped notch; however, various other notch shapes are considered. In an example embodiment, the notch 502 has an opening that is 20 to 25 µm wide and that is disposed on an edge or surface of the first contact layer 408. In an example embodiment, the notch extends 10 to 25 µm into the first contact layer 408.

Figure 6:
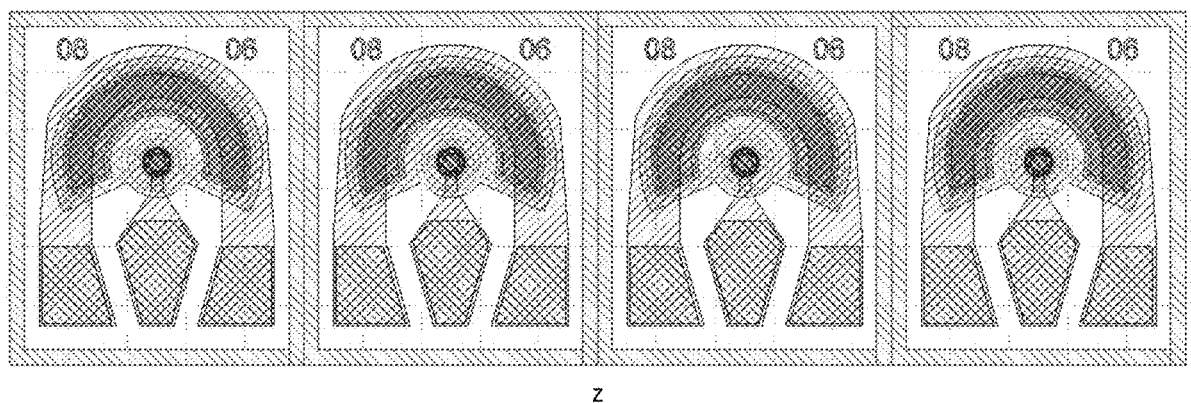
FIG. 6 illustrates a schematic top view of a ground-signal-ground VCSEL layout array according to an example embodiment.

FIG. 6 illustrates a VCSEL array 600 on an optical chip, including one or more of the VCSEL layouts 400 for a plurality of VCSELs.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A contact structure for a vertical-cavity surface-emitting laser (VCSEL) comprising:
    a VCSEL;
    an etched trench around a mesa of the VCSEL, the etched trench having an interior edge located proximate the VCSEL, a distal edge spaced from the VCSEL, and a trench bottom extending between the interior edge and the distal edge;
    a signal contact layer deposited on a section of the mesa of the VCSEL and at least partially encircling the VCSEL via a signal contact layer arc and extending a length away from the mesa to a distal end, wherein a width of the signal contact layer decreases from an inflection point line to the distal end of the signal contact layer, the inflection point line located along the length of the signal contact layer and being transverse to a direction defined by the length of the signal contact layer; and
    a ground contact layer comprising three parts:
        a first part of the ground contact layer deposited on a second arc positioned around a first arc, wherein (a) the first arc comprises the interior edge and a first portion of the trench bottom, the first portion of the trench bottom being adjacent the interior edge, and (b) the second arc (i) is concentric with the first arc and (ii) comprises a second portion of the trench bottom and the distal edge, the second portion of the trench bottom being adjacent the distal edge, and
        a second part of the ground contact layer, and
        a third part of the ground contact layer,
    wherein:
        each of the second and third parts of the ground contact layer comprises a leg extending from a respective end of the second arc and in electrical communication with the first part to a respective distal end,
        a width of each of the second and third parts of the ground contact layer increases from the inflection point line to the respective distal end of each of the second and third parts, and
        the legs are symmetrically positioned about two sides of the signal contact layer to form a ground-signal-ground configuration;
    wherein the first arc separates the signal contact layer from the first part of the ground contact layer.

2. The contact structure of claim 1, wherein the signal contact layer comprises a probe notch, wherein the probe notch is configured to guide a testing probe.

3. The contact structure of claim 1, wherein the etched trench is a portion of an annulus about the mesa of the VCSEL.

4. The contact structure of claim 3, wherein an interior edge of the annulus has a mesa diameter defined by the mesa and an outer edge of the annulus has a second diameter defined by the first part of the of the ground contact layer.

5. The contact structure of claim 1, wherein a first gap defining a first width is disposed between the second part of the ground contact layer and the signal contact layer and a second gap defining a second width is disposed between the third part of the ground contact layer and the signal contact layer, the first width being approximately the same as the second width.

6. The contact structure of claim 1, wherein the signal contact layer arc is defined by a first diameter, an interior edge of the first arc is defined by a second diameter; and the second diameter is at least approximately two times the first diameter.

7. The contact structure of claim 1, wherein the first part of the ground contact layer comprises a step, the step is disposed on the second portion of the trench bottom and adjacent the distal edge of the etched trench, and the first part of the ground contact layer of the step is thicker than a remainder of the first part of the ground contact layer disposed on the second portion of the trench bottom.

8. The contact structure of claim 1, wherein the first arc and the second arc do not overlap.

9. The contact structure of claim 1, wherein the first arc is devoid of any part of the ground contact layer or the signal contact layer.

10. A contact structure for a vertical-cavity surface-emitting laser (VCSEL) comprising:
    a VCSEL;
    a signal contact layer deposited on a section of a mesa of the VCSEL and at least partially encircling the VCSEL via a signal contact layer arc; and
    a ground contact layer comprising a first leg portion, a second leg portion, and an arc portion, the arc portion partially encircling the mesa, and the first leg portion and the second leg portion extending symmetrically from opposite ends of the arc portion, wherein the signal contact layer extends between the first leg portion and the second leg portion to form a ground-signal-ground configuration; and
    an etched trench positioned between the arc portion of the ground contact layer and a corresponding portion of the signal contact layer, the etched trench having an interior edge located proximate the VCSEL, a distal edge spaced from the VCSEL, and a trench bottom extending between the interior edge and the distal edge, wherein:
- a first arc comprises the interior edge and a first portion of the trench bottom, the first portion of the trench bottom being adjacent the interior edge,
- a second arc is concentric with the first arc and comprises a second portion of the trench bottom and the distal edge, the second portion of the trench bottom being adjacent the distal edge,
- the arc portion of the ground contact layer is deposited on the second arc,
- the first arc is devoid of any part of the ground contact layer or the signal contact layer, and
- the first arc separates the signal contact layer from the arc portion of the ground contact layer,
- the signal contact layer extends a length away from the mesa to a distal end,
- a width of the signal contact layer decreases from an inflection point line to the distal end of the signal contact layer,
- the inflection point line is located along the length of the signal contact layer and is transverse to a direction defined by the length of the signal contact layer, and
- each of a width of the first leg portion and a width of the second leg portion increases from the inflection point line to a respective distal end of each of the first leg portion and the second leg portion.

11. The contact structure of claim 10, wherein the signal contact layer comprises a probe notch, wherein the probe notch is configured to guide a testing probe.

12. The contact structure of claim 10, wherein the etched trench is a portion of an annulus about the mesa of the VCSEL.

13. The contact structure of claim 12, wherein an interior edge of the annulus has a mesa diameter defined by the mesa and an outer edge of the annulus has a second diameter defined by the arc portion of the ground contact layer.

14. The contact structure of claim 10, wherein a first gap defining a first width is disposed between the first leg portion of the ground contact layer and the signal contact layer and a second gap defining a second width is disposed between the second leg portion of the ground contact layer and the signal contact layer, the first width being approximately the same as the second width.

15. A contact structure for a vertical-cavity surface-emitting laser (VCSEL) comprising:
- a VCSEL;
- a signal contact layer deposited on a section of a mesa of the VCSEL, the signal contact layer comprising a proximate portion that encircles, at least in part, a VCSEL opening of the VCSEL, and a distal end, the distal end being spaced apart from the VCSEL by an intermediate portion of the signal contact layer extending between the proximate portion and the distal end;
- a ground contact layer comprising a first leg portion, a second leg portion, and an arc portion, the arc portion partially encircling the mesa, and the first leg portion and the second leg portion extending symmetrically from opposite ends of the arc portion, wherein the intermediate portion of the signal contact layer extends between the first leg portion and the second leg portion from the proximate portion to the distal end to form a ground-signal-ground configuration, and
- a probe notch formed completely through the distal end of the signal contact layer in a direction substantially parallel to an emission direction of the VCSEL, wherein the probe notch is configured to guide a testing probe.

16. The contact structure of claim 15, wherein the probe notch is a V-shaped notch.

17. The contact structure of claim 15, wherein the probe notch comprises a notch opening that is 20 to 25 micrometers wide.

18. The contact structure of claim 15, wherein the probe notch extends 10 to 25 micrometers into the signal contact layer.

19. The contact structure of claim 15, further comprising an etched trench positioned between the arc portion of the ground contact layer and a corresponding portion of the signal contact layer.

* * * * *